United States Patent
Tanaka et al.

(10) Patent No.: US 10,581,411 B2
(45) Date of Patent: Mar. 3, 2020

(54) RELAXATION OSCILLATOR AND WIRELESS DEVICE INCLUDING RELAXATION OSCILLATOR

(71) Applicant: ABLIC Inc., Chiba-shi, Chiba (JP)

(72) Inventors: Toshiyuki Tanaka, Chiba (JP); Biao Shen, Chiba (JP); Hiroyuki Yonetani, Chiba (JP)

(73) Assignee: ABLIC INC., Chiba (JP)

(*) Notice: Subject to any disclaimer, the term of this patent is extended or adjusted under 35 U.S.C. 154(b) by 28 days.

(21) Appl. No.: 15/992,870

(22) Filed: May 30, 2018

(65) Prior Publication Data

US 2018/0351538 A1 Dec. 6, 2018

(30) Foreign Application Priority Data

May 31, 2017 (JP) ................................ 2017-108324

(51) Int. Cl.
| | |
|---|---|
| *H03K 3/0231* | (2006.01) |
| *H03K 4/08* | (2006.01) |
| *H03K 3/03* | (2006.01) |
| *H03K 4/501* | (2006.01) |
| *H03K 3/013* | (2006.01) |
| *H03K 3/011* | (2006.01) |

(52) U.S. Cl.
CPC ....... *H03K 3/02315* (2013.01); *H03K 3/0231* (2013.01); *H03K 3/03* (2013.01); *H03K 4/08* (2013.01); *H03K 4/501* (2013.01); *H03K 3/011* (2013.01); *H03K 3/013* (2013.01)

(58) Field of Classification Search
CPC .... H03K 3/0231; H03K 3/02315; H03K 4/08; H03K 4/48; H03K 4/50; H03K 4/501; H03K 4/502; H03K 3/011
See application file for complete search history.

(56) References Cited

U.S. PATENT DOCUMENTS

| | | | |
|---|---|---|---|
| 7,432,771 B2* | 10/2008 | Chui | ................. H03K 4/502 |
| | | | 331/113 R |
| 9,325,276 B2* | 4/2016 | Huynh | ................. H03B 5/04 |
| 9,438,165 B2* | 9/2016 | Powell | ................. H03K 3/011 |
| 2009/0302954 A1 | 12/2009 | Chen et al. | |

FOREIGN PATENT DOCUMENTS

JP 2010-063086 3/2010

\* cited by examiner

*Primary Examiner* — Ryan Johnson

(74) *Attorney, Agent, or Firm* — Brinks Gilson & Lione

(57) ABSTRACT

Provided is a relaxation oscillator having an extremely small temperature deviation in oscillation frequency. A first current (I1) generated by a reference voltage source and a first resistor having a positive first-order temperature coefficient is supplied to a first variable capacitor (C1) for oscillation, and a second current (I2) generated by a reference voltage source and a second resistor having a negative first-order temperature coefficient is supplied to a second variable capacitor (C2) for oscillation. A product of a value of a ratio of a first current to a second current and a value of a ratio of a first-order temperature coefficient of the second resistor to a first-order temperature coefficient of the first resistor, and a value of a ratio of a capacitance of the first variable capacitor to a capacitance of the second variable capacitor have the same absolute value and opposite signs.

19 Claims, 11 Drawing Sheets

| MODE | CLK1 | CLK2 | CLK3 | CLKB1 | CLKB2 | CLKB3 |
|---|---|---|---|---|---|---|
| I1&I2 oscillation | CLK | CLK | Low | CLKB | CLKB | Low |
| I1 oscillation | CLK | Low | Low | Low | Low | CLKB |
| I2 oscillation | Low | Low | CLK | CLKB | Low | Low |

RELAXATION OSCILLATOR AND WIRELESS DEVICE INCLUDING RELAXATION OSCILLATOR

RELATED APPLICATIONS

This application claims priority under 35 U.S.C. § 119 to Japanese Patent Application No. 2017-108324 filed on May 31, 2017, the entire content of which is hereby incorporated by reference.

BACKGROUND OF THE INVENTION

1. Field of the Invention

The present invention relates to a relaxation oscillator.

2. Description of the Related Art

FIG. 14 is an illustration of a circuit configuration of a relaxation oscillator in related-art. The relaxation oscillator has a reference voltage source 101, a current source circuit 102, and an oscillation circuit 104.

The current source circuit 102 has a variable resistor 105, an operational amplifier 106, and PMOS transistors 107 and 108. The current source circuit 102 is supplied with a reference voltage $V_{REF}$ from the reference voltage source 101, and is supplied with a power supply voltage VDD from outside.

In the current source circuit 102, a negative feedback loop is formed so that a voltage applied to the variable resistor 105 based on the actions of the operational amplifier 106 and the PMOS transistor 107 is always equal to $V_{REF}$. In this manner, when a resistance of the variable resistor 105 is denoted by $R_{101}$, a current $I_{101}$ flowing through the variable resistor 105 is $V_{REF}/R_{101}$, and the current $I_{101}$ is increased by $n_{101}$ times based on a ratio $n_{101}$ between channel widths of the PMOS transistor 107 and the PMOS transistor 108. An output current $I_{11}$ of the current source circuit 102 is thus generated.

The oscillation circuit 104 has switches 113 to 116, a variable capacitor 119, a variable capacitor 120, a comparator 121, a comparator 123, and an SR latch circuit having a NAND gate 125 and a NAND gate 126.

The variable capacitor 119 is charged or discharged by turning on or off the switches 113 and 115. The variable capacitor 120 is charged or discharged by turning on or off the switches 114 and 116.

The switches 113 to 116 are controlled based on a signal CLK of oscillation output 129 and a signal CLKB of oscillation output 130 so that one of the switches 113 and 114 is turned off when the other is turned on, one of the switches 113 and 115 is turned off when the other is turned on, and one of the switches 114 and 116 is turned off when the other is turned on.

Output of the comparator 121 is at a Low level when a charge voltage of the variable capacitor 119 exceeds the reference voltage $V_{REF}$, and output of the comparator 123 is at a Low level when a charge voltage of the variable capacitor 120 exceeds the reference voltage $V_{REF}$.

One of the states of the oscillation output 129 and the oscillation output 130 of the SR latch circuit having the NAND gate 125 and the NAND gate 126 is at a Low level when the other is at a High level, and the states of the oscillation output 129 and the oscillation output 130 are switched at a moment when any one of the output of the comparator 121 and the output of the comparator 123 is changed to the Low level.

The reference voltage source 101 and reference voltage sources 122 and 124 included in the oscillation circuit 104 are the same voltage source (reference voltage $V_{REF}$), and those three voltage sources individually express the same voltage source.

When the resistance of the variable resistor 105 is denoted by $R_{101}$, a capacitance of the variable capacitor 119 is denoted by $C_{101}$, and a capacitance of the variable capacitor 120 is denoted by $C_{102}$, an oscillation frequency of the relaxation oscillator in related-art is denoted by Equation (1):

$$f = \frac{n_{101}}{R_{101}(C_{101} + C_{102})} \qquad (1)$$

where $n_{101}$ is a ratio (gate width of PMOS transistor 108)/(gate width of PMOS transistor 107) in channel width of a current-mirror circuit of the current source circuit 102.

When the relaxation oscillator in related-art illustrated in FIG. 14 is formed on a semiconductor chip, there is a disadvantage in that the oscillation frequency largely varies due to a temperature coefficient of the variable resistor 105.

In a general semiconductor process, an absolute value of a first-order temperature coefficient of a diffusion resistor or a polysilicon resistor (Poly resistor) is large, that is, from about several hundreds of ppm/° C. to about several thousands of ppm/° C. When a resistor having a first-order temperature coefficient of 1,000 ppm/° C. is used as the variable resistor 105 and the temperature changes by 50° C., the oscillation frequency also varies by 5%. The relaxation oscillator in related-art formed on the semiconductor chip may not therefore be a stable frequency source.

In order to reduce the variation in oscillation frequency due to temperature, there has been employed a method in which a resistor having a positive temperature coefficient and a resistor having a negative temperature coefficient are connected in series or parallel to be used (for example, Japanese Patent Application Laid-open No. 2010-63086).

The improvement in the relaxation oscillator in related-art has been insufficient in terms of frequency variation that is proportional to a first-order equation of a temperature variation amount (hereinafter referred to as "first-order frequency deviation").

SUMMARY OF THE INVENTION

The present invention has an object to achieve a relaxation oscillator that is highly stable with respect to temperature.

There is provided a relaxation oscillator including: a reference voltage source configured to supply a reference voltage; a first current source circuit having a first resistor, and configured to generate a first current based on the reference voltage; a second current source circuit having a second resistor and configured to generate a second current based on the reference voltage; a first variable capacitor; a second variable capacitor; a first switch configured to control charging from the first current source circuit to the first variable capacitor; a second switch configured to control charging from the second current source circuit to the second variable capacitor; a third switch configured to control discharging of charges in the first variable capacitor; a fourth switch configured to control discharging of charges in the second variable capacitor; a first comparator configured to compare a voltage of the first variable capacitor with the reference voltage source; a second comparator configured to compare a voltage of the second variable capacitor with the reference voltage source; and an SR latch circuit configured to receive an output of the first comparator and an output of the second comparator, wherein a product of a ratio of the first current to the second current and a ratio of a first-order temperature coefficient of the second resistor to a first-order temperature coefficient of the first resistor, and a ratio of a capacitance of the first variable capacitor to a capacitance of the second variable capacitor have the same absolute value and opposite signs.

According to the relaxation oscillator of the present invention, the relaxation oscillator having an extremely small temperature deviation in oscillation frequency can be provided.

DETAILED DESCRIPTION OF THE EMBODIMENTS

Now, embodiments of a relaxation oscillator of the present invention are described with reference to the drawings.

First Embodiment

Figure 1:
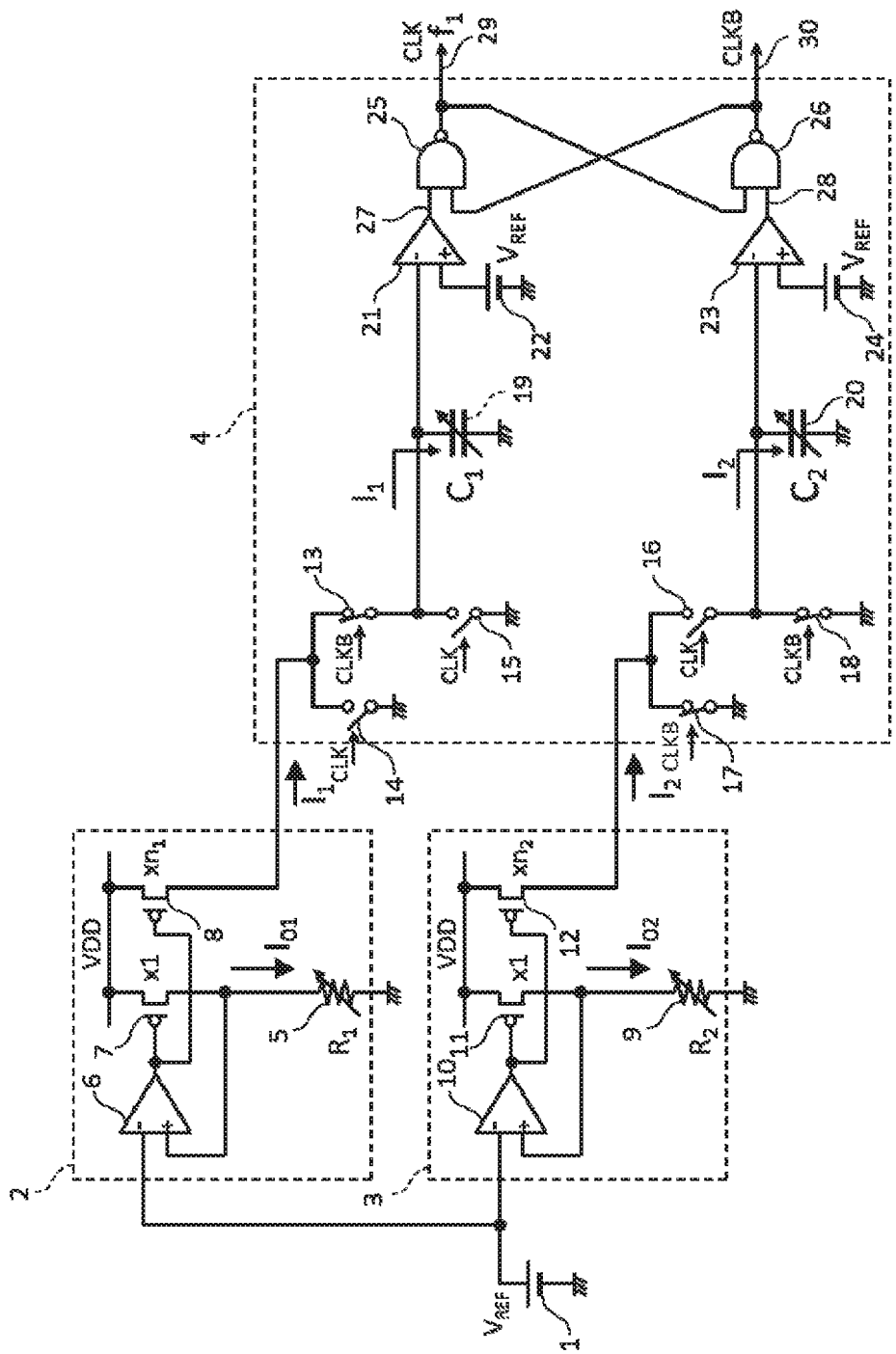
FIG. 1 is a diagram for illustrating a configuration of a relaxation oscillator according to a first embodiment of the present invention.

FIG. 1 is a diagram for illustrating a configuration of a relaxation oscillator according to a first embodiment of the present invention.

The relaxation oscillator according to the first embodiment has a reference voltage source 1, a current source circuit 2, a current source circuit 3, and an oscillation circuit 4.

The current source circuit 2 has a variable resistor 5, an operational amplifier 6, and PMOS transistors 7 and 8. The current source circuit 2 is supplied with a reference voltage $V_{REF}$ from the reference voltage source 1, and is supplied with a power supply voltage VDD from outside.

The current source circuit 3 has a variable resistor 9, an operational amplifier 10, and PMOS transistors 11 and 12. The current source circuit 3 is supplied with a reference voltage $V_{REF}$ from the reference voltage source 1, and is supplied with a power supply voltage VDD from outside.

In this case, the variable resistor 5 and the variable resistor 9 have first-order temperature coefficients having opposite signs.

In the current source circuit 2, a negative feedback loop is formed so that a voltage applied to the variable resistor 5 based on the actions of the operational amplifier 6 and the PMOS transistor 7 is always equal to $V_{REF}$. In this manner, when a resistance of the variable resistor 5 is denoted by $R_1$, a current $I_{01}$ flowing through the variable resistor 5 is $V_{REF}/R_1$, and the current $I_{01}$ is increased by $n_1$ times based on a ratio $n_1$ between channel widths of the PMOS transistor 7 and the PMOS transistor 8. An output current $I_1$ of the current source circuit 2 is thus generated.

Similarly, in the current source circuit 3, when a resistance of the variable resistor 9 is denoted by $R_2$, a current $I_{02}$ flowing through the variable resistor 9 is $V_{REF}/R_2$, and the current $I_{02}$ is increased by $n_2$ times based on a ratio $n_2$ between channel widths of the PMOS transistor 11 and the PMOS transistor 12. An output current $I_2$ of the current source circuit 3 is thus generated.

The oscillation circuit 4 has switches 13 to 18, a variable capacitor 19, a variable capacitor 20, a comparator 21, a comparator 23, and an SR latch circuit having a NAND gate 25 and a NAND gate 26. The reference voltage source 1 and reference voltage sources 22 and 24 included in the oscillation circuit 4 are the same power source, and those three voltage sources only express the same voltage source individually on the diagram.

The variable capacitor 19 is charged or discharged by turning on or off the switches 13 to 15. The variable capacitor 20 is charged or discharged by turning on or off the switches 16 to 18.

The switches 13 to 18 are controlled based on a signal CLK of oscillation output 29 and a signal CLKB of oscillation output 30 so that one of the switches 13 and 16 is turned off when the other is turned on, one of the switches 13 and 15 is turned off when the other is turned on, one of the switches 16 and 18 is turned off when the other is turned on, one of the switches 13 and 14 is turned off when the other is turned on, and one of the switches 16 and 17 is turned off when the other is turned on.

Output from an output terminal 27 of the comparator 21 is at a Low level when a charge voltage of the variable capacitor 19 exceeds the reference voltage $V_{REF}$, and output from an output terminal 28 of the comparator 23 is at a Low level when the charge voltage of the variable capacitor 20 exceeds the reference voltage $V_{REF}$.

One of the states of the oscillation output 29 and the oscillation output 30 of the SR latch circuit having the NAND gate 25 and the NAND gate 26 is at a Low level when the other is at a High level, and the states of the oscillation output 29 and the oscillation output 30 are switched at a moment when any one of the output terminal 27 of the comparator 21 and the output terminal 28 of the comparator 23 is changed to the Low level.

Figure 2:
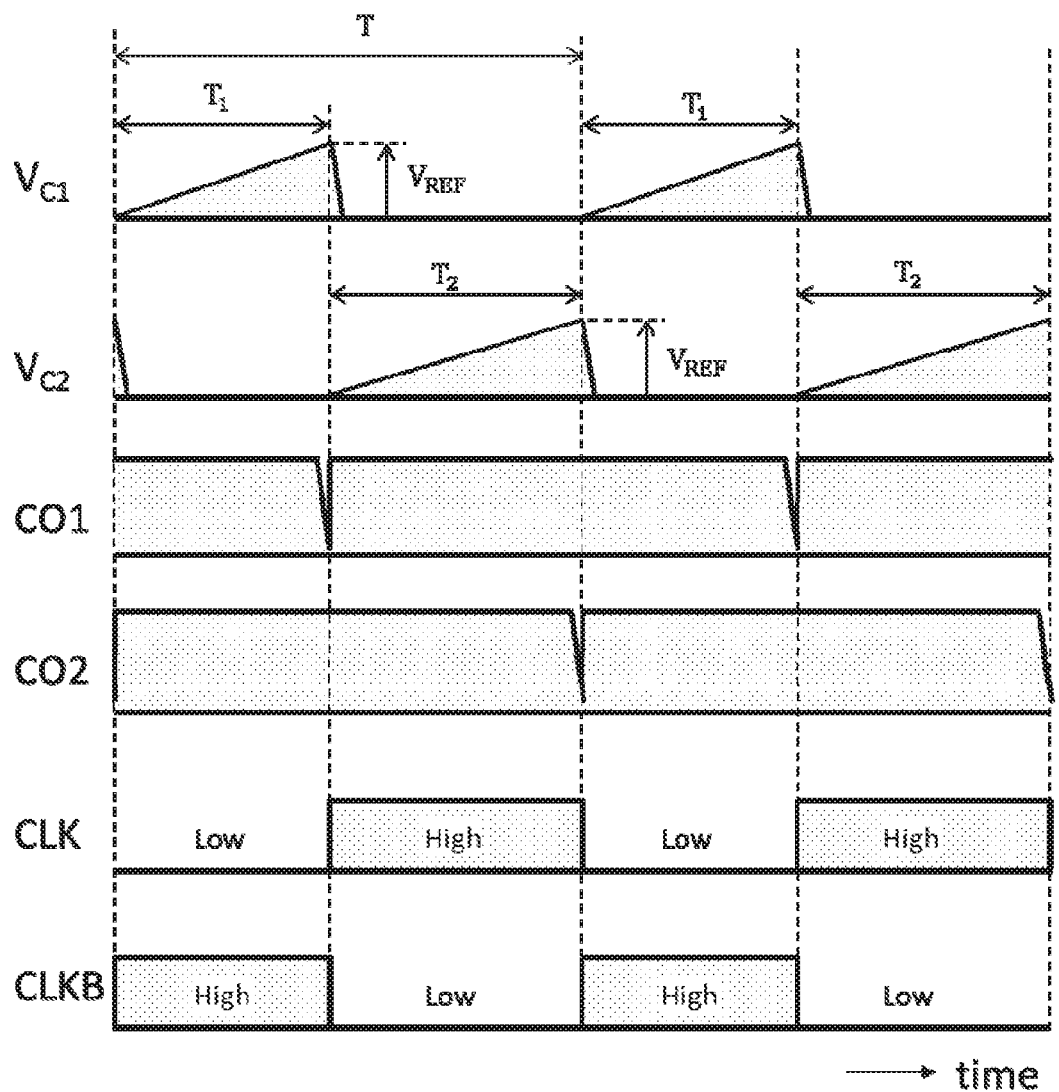
FIG. 2 is an illustration of operation waveforms of the relaxation oscillator according to the first embodiment of the present invention.

FIG. 2 is an illustration of operation waveforms of respective sections of the relaxation oscillator according to the first embodiment of the present invention. The oscillation operation is performed in the following order.

Under a state in which the signal CLK of the oscillation output 29 is Low and the signal CLKB of the oscillation output 30 is High, the switch 13 is in the ON state and the switch 15 is in the OFF state. The variable capacitor 19 is thus charged with the output current $I_1$ of the current source circuit 2 so that a charge potential $V_{C1}$ increases. When the charge potential $V_{C1}$ reaches $V_{REF}$, a potential CO1 at the output terminal 27 of the comparator 21 decreases to the Low level for an instant, and logics of the signal CLK of the oscillation output 29 and the signal CLKB of the oscillation output 30 of the SR latch circuit having the NAND gates 25 and 26 are reversed. The switch 13 is changed to the OFF state and the switch 15 is changed to the ON state, and thus charges charged in the variable capacitor 19 are discharged.

Under a state in which the signal CLK of the oscillation output 29 is High and the signal CLKB of the oscillation output 30 is Low, the switch 16 is in the ON state and the switch 18 is in the OFF state. The variable capacitor 20 is thus charged with the output current $I_2$ of the current source circuit 3 so that a charge potential $V_{C2}$ increases. When the charge potential $V_{C2}$ reaches $V_{REF}$, a potential CO2 at the output terminal 28 of the comparator 23 decreases to the Low level for an instant, and logics of the signal CLK of the oscillation output 29 and the signal CLKB of the oscillation output 30 of the SR latch circuit having the NAND gates 25 and 26 are reversed. The switch 16 is changed to the OFF state and the switch 18 is changed to the ON state, and thus charges charged in the variable capacitor 20 are discharged.

With the above-mentioned series of operation, a period ($T_1$) in which the variable capacitor 19 is charged with the reference current $I_1$ and a period ($T_2$) in which the variable capacitor 20 is charged with the reference current $I_2$ are alternately switched, and an oscillation state is maintained at a period of $T=T_1+T_2$.

Now, a principle of frequency deviation compensation for the oscillation frequency in the relaxation oscillator (FIG. 1) according to the first embodiment of the present invention is described.

First, resistance of the variable resistor 5 and the variable resistor 9 in which first-order and second-order temperature coefficients are taken into consideration can be expressed as Equation (2) and Equation (3), respectively:

$$R_1 = R_{01}(1+\alpha_1 \Delta T + \alpha_2 \Delta T^2) \quad (2)$$

$$R_2 = R_{02}(1+\beta_1 \Delta T + \beta_2 \Delta T^2) \quad (3)$$

where $\Delta T$ is a temperature variation from a reference temperature $T_0$, $R_{01}$ is a resistance of the variable resistor 5 at the reference temperature, $R_{02}$ is a resistance of the variable resistor 9 at the reference temperature, $\alpha_1$ is a first-order temperature coefficient of the variable resistor 5, $\alpha_2$ is a second-order temperature coefficient of the variable resistor 5, $\beta_1$ is a first-order temperature coefficient of the variable resistor 9, and $\beta_2$ is a second-order temperature coefficient of the variable resistor 9.

An oscillation frequency f in this case can be expressed as Equation (4):

$$f = \frac{1}{C_1 R_1/n_1 + C_2 R_2/n_2} \quad (4)$$

$$= \frac{1}{C_1 R_{01}/n_1 + C_2 R_{02}/n_2 + (\alpha_1 C_1 R_{01}/n_1 + \beta_1 C_2 R_{02}/n_2)\Delta T + (\alpha_2 C_1 R_{01}/n_1 + \beta_2 C_2 R_{02}/n_2)\Delta T^2}$$

where $C_1$ is a capacitance of the variable capacitor 19, $C_2$ is a capacitance of the variable capacitor 20, $n_1$ is a ratio in channel width of the current-mirror circuit of the current source circuit 2 ((gate width of PMOS transistor 8)/(gate width of PMOS transistor 7)), and $n_2$ is a ratio in channel width of the current-mirror circuit of the current source circuit 3 ((gate width of PMOS transistor 12)/(gate width of PMOS transistor 11)).

A condition for canceling the first-order frequency deviation is that the third term (term with $\Delta T$) of the denominator of Equation (4) vanishes, and expressed by Equation (5).

$$\frac{C_1}{C_2} = -\frac{n_1}{n_2}\frac{R_{02}}{R_{01}}\frac{\beta_1}{\alpha_1} = -\frac{n_1}{R_{01}}\frac{R_{02}}{n_2}\frac{\beta_1}{\alpha_1} = -\frac{I_1}{V_{REF}}\frac{V_{REF}}{I_2}\frac{\beta_1}{\alpha_1} = -\frac{I_1}{I_2}\frac{\beta_1}{\alpha_1} \quad (5)$$

To satisfy the condition of Equation (5) the right side has a positive value. That is, in order to cancel the first-order frequency deviation of the oscillation frequency, two types of resistors should be used in which one of the first-order temperature coefficient $\alpha_1$ of the variable resistor 5 and the first-order temperature coefficient $\beta_1$ of the variable resistor 9 has a negative value and the other has a positive value. Besides, the capacitances $C_1$ and $C_2$ at the reference temperature $T_0$ are set to have a capacitance ratio that is determined based on the first-order temperature coefficients $\alpha_1$ and $\beta_1$ of the resistors, the output current $I_1$ of the current source circuit 2, and the output current $I_2$ of the current source circuit 3. In this manner, the first-order frequency deviation of the oscillation frequency is canceled and becomes zero.

Further, when $C_1$ and $C_2$ at the reference temperature $T_0$ ($\Delta T=0$) are defined as $C_{01}$ and $C_{02}$, respectively, and a total value thereof is denoted by C as expressed in Equation (6), the capacitances at which the first-order frequency deviation becomes zero correspond to Equation (7) and Equation (8).

$$C = C_{01} + C_{02} \quad (6)$$

$$C_{01} = C \frac{n_1 R_{02} \beta_1}{n_1 R_{02} \beta_1 - n_2 R_{01} \alpha_1} \quad (7)$$

$$C_{02} = C \frac{n_2 R_{01} \alpha_1}{n_2 R_{01} \alpha_1 - n_1 R_{02} \beta_1} \quad (8)$$

Next, a condition for canceling the second-order frequency deviation is described.

First, when Equation (4) is solved for the capacitances $C_1$ and $C_2$ at which the third term (term with $\Delta T$) and the fourth term (term with $\Delta T^2$) of the denominator whose values change depending on temperature become zero, approximate solutions thereof are Equation (9) and Equation (10):

$$C_1 \approx C_{01}\left[1 + \left(\frac{\beta_2}{\beta_1} - \frac{n_1 R_{02} \beta_2 - n_2 R_{01} \alpha_2}{n_1 R_{02} \beta_1 - n_2 R_{01} \alpha_1}\right)\Delta T\right] \equiv C_{01} + C_{01}\gamma_1 \Delta T \quad (9)$$

$$C_2 \approx C_{02}\left[1 + \left(\frac{\alpha_2}{\alpha_1} - \frac{n_2 R_{01} \alpha_2 - n_1 R_{02} \beta_2}{n_2 R_{01} \alpha_1 - n_1 R_{02} \beta_1}\right)\Delta T\right] \equiv C_{02} + C_{02}\gamma_2 \Delta T \quad (10)$$

where $\gamma_1$, $\gamma_2$, and $\Delta C$ are defined as follows.

$\gamma_1$: temperature coefficient of $C_1$ for compensating for the second-order frequency deviation $$\gamma_1 = \frac{\beta_2}{\beta_1} - \frac{n_1 R_{02} \beta_2 - n_2 R_{01} \alpha_2}{n_1 R_{02} \beta_1 - n_2 R_{01} \alpha_1} \quad (11)$$

$\gamma_2$: temperature coefficient of $C_2$ for compensating for the second-order frequency deviation $$\gamma_2 = \frac{\alpha_2}{\alpha_1} - \frac{n_2 R_{01} \alpha_2 - n_1 R_{02} \beta_2}{n_2 R_{01} \alpha_1 - n_1 R_{02} \beta_1} \quad (12)$$

Further, in Equation (9) and Equation (10), relationships of Equation (11) and Equation (12) are satisfied. Amounts $\Delta C$ of $C_1$ and $C_2$ which are increased and decreased in proportion to the temperature in order to compensate for the second-order frequency deviation have the same magnitude.

$$\Delta C = C_{01}\gamma_1 \Delta T = -C_{02}\gamma_2 \Delta T \quad (13)$$

In other words, it is only required to perform control in which $C_1$ is increased by $\Delta C$ and $C_2$ is decreased by $\Delta C$ in proportion to the temperature variation amount $\Delta T$. That is, a total value of $C_1$ and $C_2$ is constant regardless of temperature. Further, $|C_{01}\gamma_1|=|C_{02}\gamma_2|$ holds, and hence any one of $\gamma_1$ and $\gamma_2$ is calculated, the other can be obtained by only changing the sign.

The second term of each of $C_1$ and $C_2$ denoted by Equation (9) and Equation (10) changes on the temperature $\Delta T$, and hence a constant oscillation frequency cannot be obtained only with the conditions for the two equations because the first term and the second term of the denominator of Equation (4) change in magnitude on temperature. In order to obtain a constant oscillation frequency regardless of temperature, there is further required a condition in which the third term (term with $\Delta T$) of following Equation (14) obtained by substituting Equation (9) and Equation (10) for $C_1$ and $C_2$ of Equation (4), becomes zero.

$$\begin{aligned} f &= \frac{1}{C_1 R_{01}/n_1 + C_2 R_{02}/n_2} \\ &= \frac{1}{(C_{01} + C_{01}\gamma_1\Delta T)R_{01}/n_1 + (C_{02} + C_{02}\gamma_2\Delta T)R_{02}/n_2} \\ &= \frac{1}{C_1 R_{01}/n_1 + C_2 R_{02}/n_2 + (C_{01}\gamma_1 R_{01}/n_1 + C_{02}\gamma_2 R_{02}/n_2)\Delta T} \end{aligned} \quad (14)$$

The condition in which the third term of the denominator of Equation (14) vanishes (that is, another condition for canceling the second-order frequency deviation) has a relationship of Equation (13), and hence Equation (15) is derived.

$$R_{01}/n_1 = R_{02}/n_2 \quad (15)$$

The relationship of Equation (14) corresponds to setting the output current $I_1$ of the current source circuit 2 and the output current $I_2$ of the current source circuit 3 to be equal to each other ($I_1=I_2$), and this condition is indispensable for canceling and setting the second-order frequency deviation to zero in the relaxation oscillator of the present invention.

To sum up the above-mentioned conditions for canceling the second-order frequency deviation:

First, at the reference temperature $T_0$, the output currents $I_1$ and $I_2$ of the current source circuit 2 and the current source circuit 3 are set to be equal to each other, and then $C_1$ and $C_2$ are adjusted to set the oscillation frequency f to a desired value. At this time, the relationship $I_1=I_2$ holds, and hence the oscillation frequency f is determined based on the total value C of $C_1$ and $C_2$, and is independent of the ratio therebetween.

Next, in order to cancel the first-order frequency deviation in advance, the ratio between $C_1$ and $C_2$ at the reference temperature $T_0$ is determined based on Equation (7) and Equation (8).

Further, in order to cancel the second-order frequency deviation, when the temperature changes from the reference temperature $T_0$ by $\Delta T$, the value of $\Delta C$ is calculated by Equation (13) according to the temperature coefficient $\gamma 1$ denoted by Equation (11) or the temperature coefficient $\gamma_2$ denoted by Equation (12), and control is performed so that the capacitance $C_1$ of the variable capacitor 19 is increased by $\Delta C$ and the capacitance $C_2$ of the variable capacitor 20 is decreased by $\Delta C$. That is, the capacitances of the variable capacitors 19 and 20 are adjusted according to the temperature so that the total capacitance C of the variable capacitors 19 and 20 is always kept constant even when the temperature changes.

A duty ratio of the oscillation output is not constant, and varies due to the correction for temperature. A constant duty ratio can be obtained by, for example, doubling the oscillation frequency from the target frequency and dividing the frequency by two.

Figure 3:
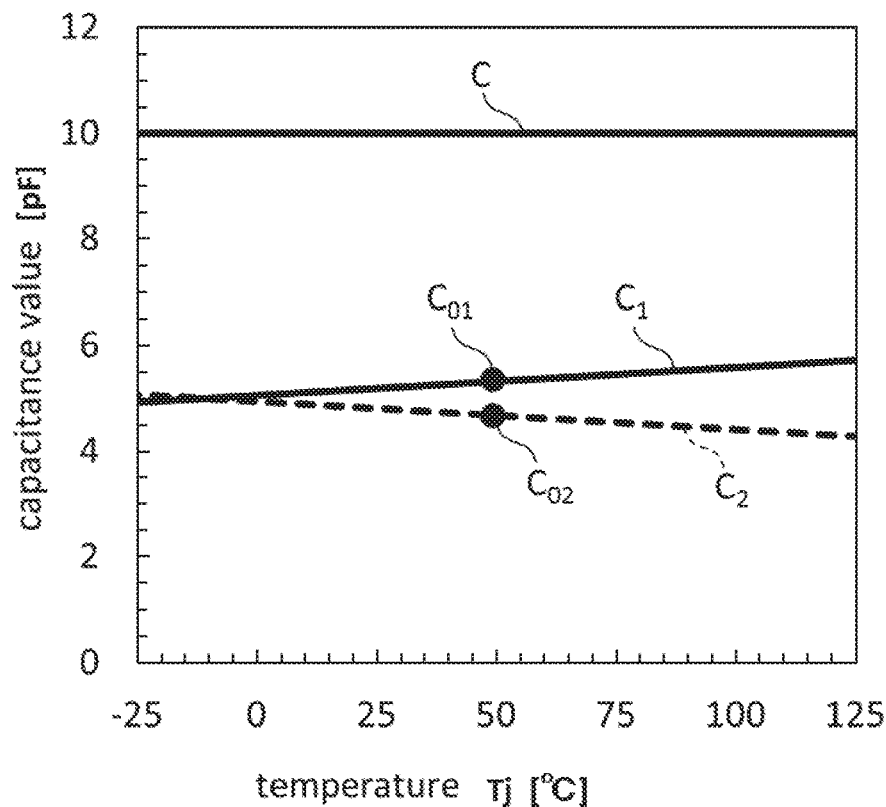
FIG. 3 is a graph for showing values of variable capacitors with respect to temperature in the relaxation oscillator according to the first embodiment of the present invention.
Figure 4:
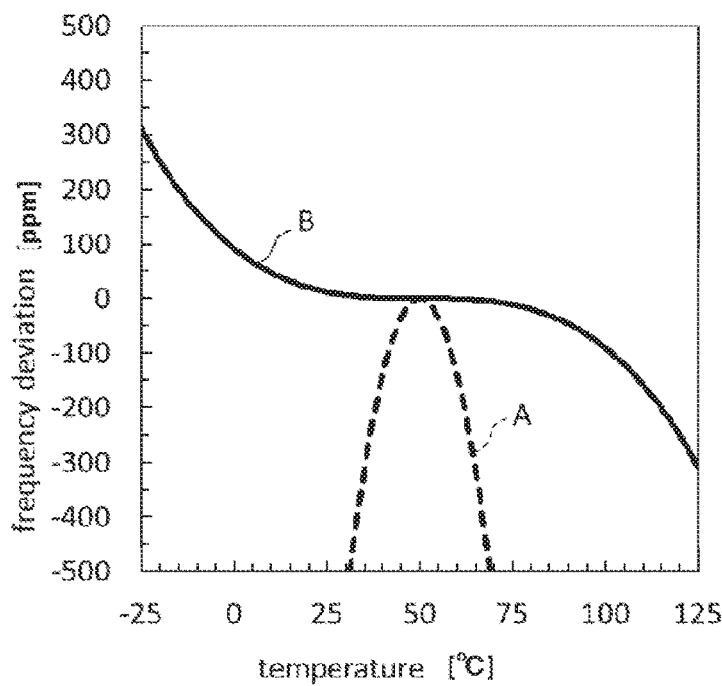
FIG. 4 is a graph for showing temperature characteristics of an oscillation frequency of the relaxation oscillator according to the first embodiment of the present invention.

FIG. 3 and FIG. 4 are graphs for showing characteristics at the time when the variable capacitor 19 and the variable capacitor 20 are controlled based on the above-mentioned principle of frequency deviation compensation in the relaxation oscillator according to the first embodiment of the present invention.

Conditions in this case are as follows: Ratios in the current mirror circuits are selected as $n_1=n_2=1$, the resistances of the variable resistors 5 and 9 at the reference temperature $T_0=50°$ C. are 50 kΩ ($R_{O1}=R_{O2}=50$ kΩ), equal to each other, and the temperature coefficients of the resistors are $\alpha_1=-1.232E-3$ [-/° C.], $\alpha_2=2.04E-6$ [-/° C.^2], $\beta_1=1.4202E-3$ [-/° C.], and $\beta_2=6.6E-7$ [-/° C.^2].

FIG. 3 is a graph for the capacitances $C_1$ and $C_2$ of the variable capacitors 19 and 20, respectively, with respect to the temperature, and is showing an example in which the total value C of $C_1$ and $C_2$ is constant at 10 pF regardless of temperature, values of $C_1$ and $C_2$ at the reference temperature $T_0$ (=50° C.) are $C_{O1}$ and $C_{O2}$, respectively, and $C_{O1}$ and $C_{O2}$ are varied in proportion to the temperature change based on the above-mentioned compensation principle.

FIG. 4 is a graph for showing frequency deviation characteristics of the relaxation oscillator according to the first embodiment of the present invention. The characteristic of curve A in FIG. 4 corresponds to frequency deviation in a case in which the capacitances $C_1$ and $C_2$ of the variable capacitors 19 and 20 are fixed to $C_{O1}$ and $C_{O2}$, respectively, regardless of temperature. In this case, the first-order frequency deviation vanishes, and the second-order frequency deviation remains uncompensated.

The characteristic of curve B in FIG. 4 corresponds to frequency deviation in a case in which the capacitances $C_1$ and $C_2$ of the variable capacitors 19 and 20 are controlled in accordance with temperature as capacitances shown in FIG. 3 based on the above-mentioned compensation principle. The frequency deviation does not completely vanish because the conditions for canceling the second-order frequency deviation are approximate solutions. The frequency deviation in the temperature range of 50° C.±35° C. is, however, ±27.7 ppm which is extremely smaller than that of a relaxation CR oscillator in related-art and is a value close to that of a crystal oscillator.

Though the frequency deviation increases in low-temperature and high-temperature regions in the characteristic curve of FIG. 4, frequency deviation can be decreased to zero throughout the entire temperature range if resistors having the same second-order temperature coefficient can be used for the variable resistor 5 and the variable resistor 9.

Second Embodiment

Figure 5:
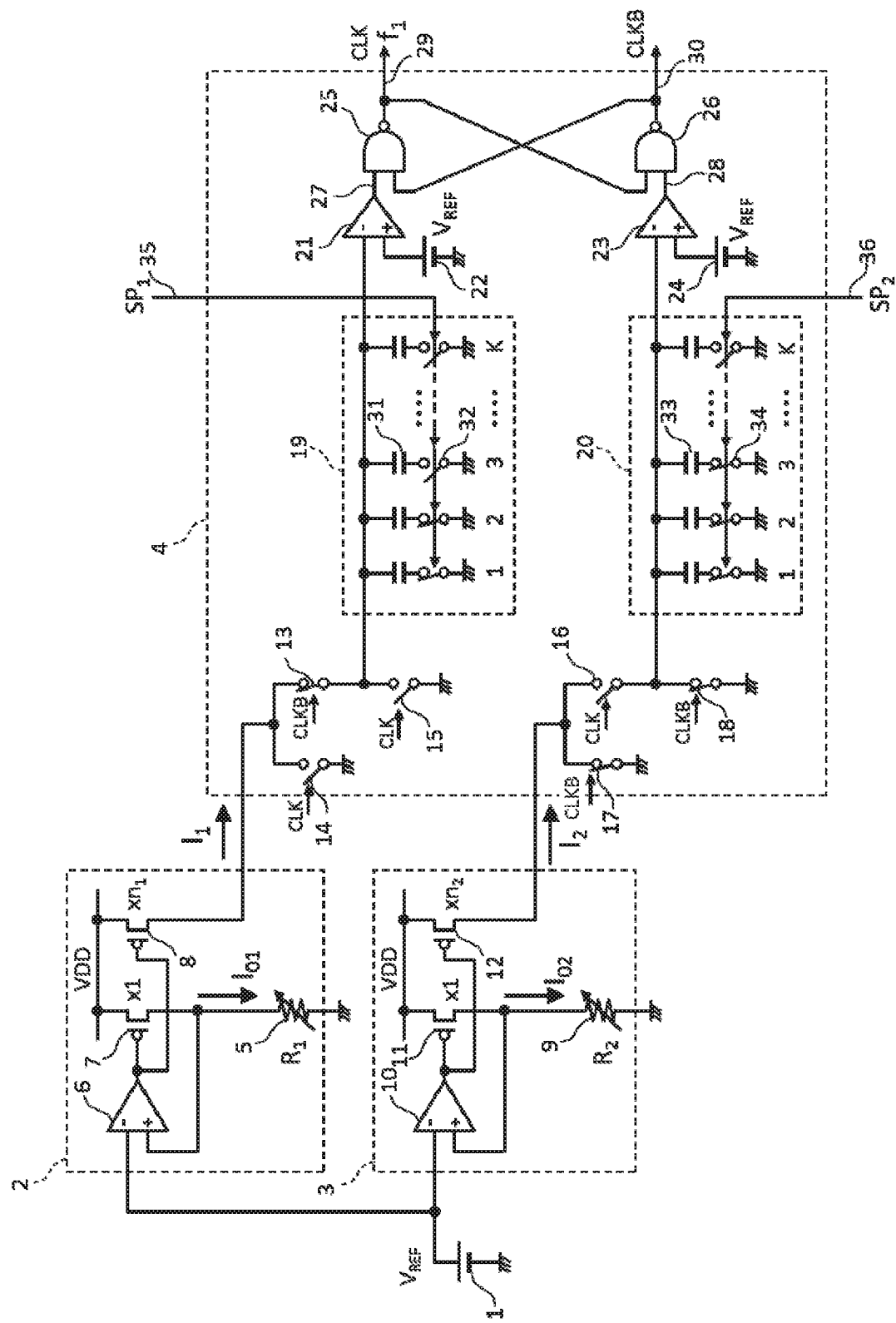
FIG. 5 is a diagram for illustrating a configuration of a relaxation oscillator according to a second embodiment of the present invention.

FIG. 5 is an illustration of a configuration of a relaxation oscillator according to a second embodiment of the present invention. FIG. 5 is an illustration of a further specific configuration of the relaxation oscillator for the first embodiment of the present invention.

The variable capacitor 19 shown in the first embodiment is formed by connecting in parallel K units of a unit capacitor 31 and a switch 32 connected in series. The variable capacitor 20 in the first embodiment is formed by connecting in parallel K units of a unit capacitor 33 and a switch 34 connected in series.

The capacitance of the variable capacitor 19 is controlled by a digital value $SP_1$ from a variable capacitor setting terminal 35, and the capacitance of the variable capacitor 20 is controlled by a digital value $SP_2$ from a variable capacitor setting terminal 36.

$SP_1$ is a signal for controlling the number of switches 32 to be turned on, and $SP_2$ is a signal for controlling the number of switches 34 to be turned on.

When the relaxation oscillator (FIG. 5) oscillates at a desired frequency $f_0$, the number of switches 32 of the variable capacitor 19 to be turned on is denoted by $P_1$, the number of switches 34 of the variable capacitor 20 to be turned on is denoted by $P_2$, and a total number of $P_1$ and $P_2$ is denoted by P (Equation (16)). When the second-order frequency deviation is canceled, based on the above-mentioned principle of frequency deviation, P is always maintained to a constant value even when the temperature changes.

$$P=P_1+P_2 \ldots \text{constant} \quad (16)$$

When the condition in which the frequency deviation of the relaxation oscillator (FIG. 5) becomes zero is expressed by using the numbers P, $P_1$, and $P_2$ of unit capacitors for which the switch is turned on, Equation (17) to Equation (21) are obtained:

$$P_{01} = P \frac{n_1 R_{02} \beta_1}{n_1 R_{02} \beta_1 - n_2 R_{01} \alpha_1} \quad (17)$$

$$P_{02} = P \frac{n_2 R_{01} \alpha_1}{n_2 R_{01} \alpha_1 - n_1 R_{02} \beta_1} \quad (18)$$

$$P_1 = P_{01}(1 + \gamma_1 \Delta T) = P_{01} + \Delta P \quad (19)$$

$$P_2 = P_{02}(1 + \gamma_2 \Delta T) = P_{02} - \Delta P \quad (20)$$

$$\Delta P = P_{01} \gamma_1 \Delta T = -P_{02} \gamma_2 \Delta T \quad (21)$$

where, in Equation (17) to Equation (21), $P_{01}$ is a value of a setting value $P_1$ of the variable capacitor 19 at the reference temperature $T_0$ (number of switches 32 to be turned on at the reference temperature $T_0$), $P_{02}$ is a value of a setting value $P_2$ of the variable capacitor 20 at the reference temperature $T_0$ (number of switches 34 to be turned on at the reference temperature $T_0$), and $\Delta P$ is the correction number of unit capacitors for compensating for the second-order frequency deviation.

With the above-mentioned configuration, the capacitances of the variable capacitors 19 and 20 can be easily changed in accordance with the temperature change while the sum of the variable capacitors 19 and 20 is kept constant.

Third Embodiment

Figure 6:
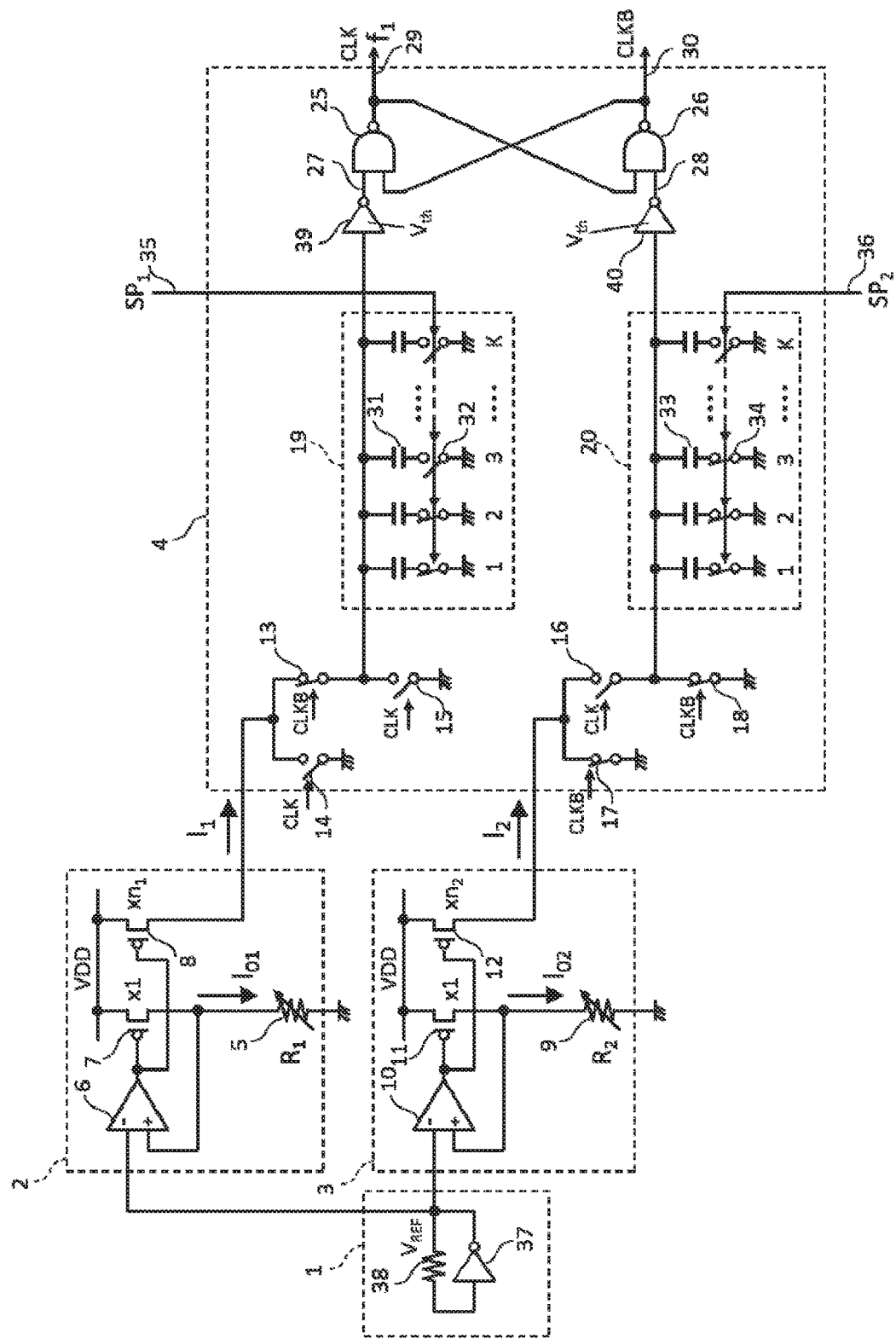
FIG. 6 is a diagram for illustrating a configuration of a relaxation oscillator according to a third embodiment of the present invention.

FIG. 6 is an illustration of a relaxation oscillator according to a third embodiment of the present invention. In the third embodiment, inverter circuits 39 and 40 having the same threshold voltage $V_{th}$ (turnover voltage) are used instead of the comparators 21 and 23 in the second embodiment (FIG. 5), and an inverter circuit 37, which is the same as the inverter circuits 39 and 40, is used as the reference voltage source 1 in the second embodiment.

In the inverter circuit 37, an output voltage is fed back to the input by a feedback resistor 38, and hence the output voltage $V_{REF}$ converges to a threshold voltage $V_{th}$ of the inverter. In the relaxation oscillator according to the third embodiment, the threshold voltage $V_{th}$ of the inverter circuits 39 and 40 and $V_{REF}$ are always maintained in the same condition even when the power supply voltage VDD changes. The oscillation frequency is therefore independent of the power supply voltage VDD and the threshold voltage $V_{th}$ of the inverters. This characteristic does not change from that of the relaxation oscillator according to the second embodiment of the present invention.

That is, the third embodiment has an advantage in that the circuit scale can be reduced by replacing the comparators with the inverter circuits while the same characteristic as that of the relaxation oscillator according to the second embodiment of the present invention is maintained.

Fourth Embodiment

Figure 7:
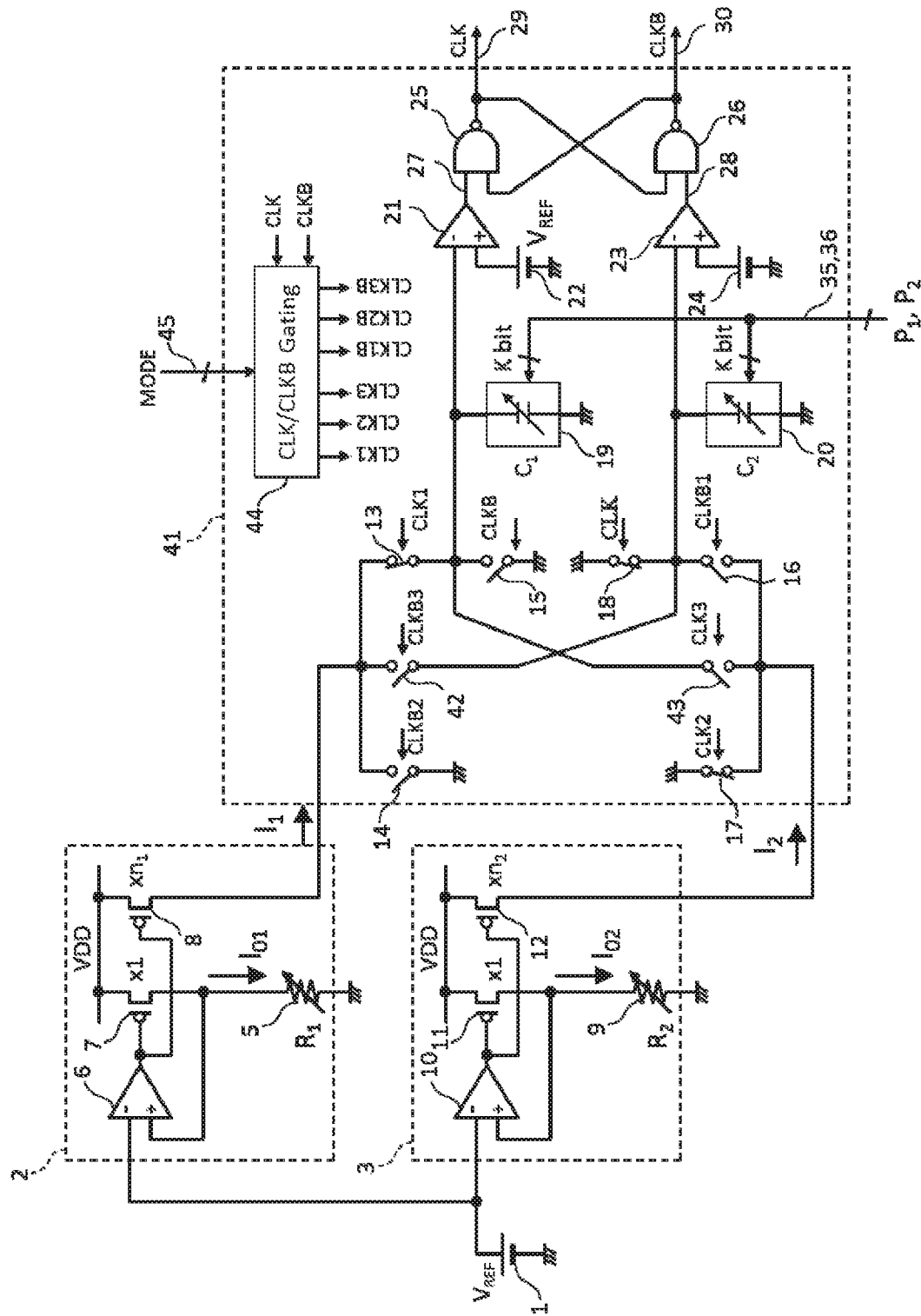
FIG. 7 is a diagram for illustrating a configuration of a relaxation oscillator according to a fourth embodiment of the present invention.

FIG. 7 is an illustration of a relaxation oscillator according to a fourth embodiment of the present invention. As described above with reference to Equation (15), during the compensation for the second-order frequency deviation, the condition of $R_{01}/n_1 = R_{02}/n_2$, that is, $I_1 = I_2$, is indispensable, and hence the resistances $R_1$ and $R_2$ of the variable resistor 5 and the variable resistor 9 should be adjusted so that the output current $I_1$ of the first current source circuit 2 and the output current $I_2$ of the second current source circuit 3 satisfy $I_1 = I_2$.

The relaxation oscillator according to the fourth embodiment of the present invention illustrated in FIG. 7 is improved so that this adjustment can be executed easily and accurately through measurement of the oscillation frequency. This relaxation oscillator is obtained by adding, to the oscillation circuit 4 of the relaxation oscillator (FIG. 5) according to the second embodiment of the present invention, a switch 42 for supplying the output current of the current source circuit 2 to the variable capacitor 20, a switch 43 for supplying the output current of the current source circuit 3 to the variable capacitor 19, and a gating circuit 44.

Figures 8, 9:
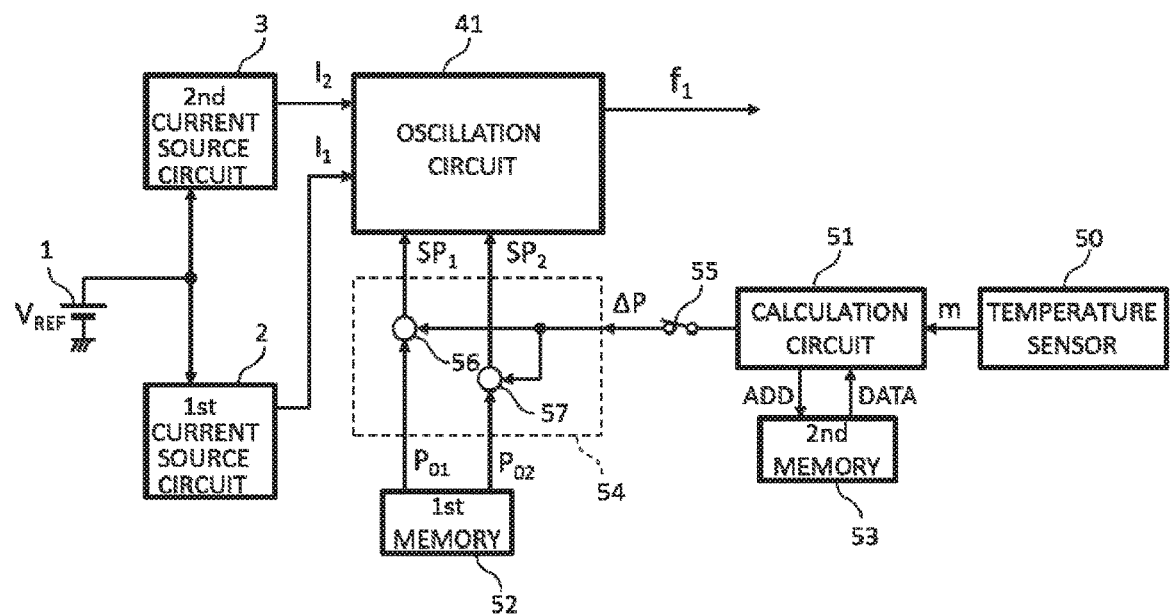
FIG. 8 is a table for showing logics of input and output of a gating circuit of the relaxation oscillator according to the fourth embodiment of the present invention.
FIG. 9 is a diagram for illustrating a configuration of a relaxation oscillator according to a fifth embodiment of the present invention.

The gating circuit 44 controls the switches 13, 14, 16, 17, 42, and 43 with the signal CLK from the oscillation output 29 and the signal CLKB from the oscillation output 30 of the SR latch circuit in accordance with a control value (MODE) which is set at an operation mode setting terminal 45. Logics of input and output of the gating circuit 44 are shown in FIG. 8.

In this manner, in the relaxation oscillator according to the fourth embodiment, in a first operation mode ($I_1$&$I_2$ oscillation mode), the oscillation is maintained as follows: The switch 42 and the switch 43 are fixed in a non-conductive state, the switch 13 and the switch 16 alternately repeat conduction, the switch 13 and the switches 14 and 15 repeat conduction in antiphase, and the switch 16 and the switches 17 and 18 repeat conduction in antiphase. That is, similarly to the oscillation circuits of FIG. 1, FIG. 5, and FIG. 6, oscillation is performed by charging the variable capacitor 19 with the current $I_1$ supplied from the current source circuit 2, and charging the variable capacitor 20 with the current $I_2$ supplied from the current source circuit 3.

In a second operation mode oscillation mode), the oscillation is maintained as follows: The switches 14, 16, 17, and 43 are fixed in a non-conductive state, the switches 13 and 42 alternately repeat conduction, the switch 13 and the switch 15 repeat conduction in antiphase, and the switch 42 and the switch 18 repeat conduction in antiphase. That is, an oscillation circuit 41 oscillates by charging the variable capacitors 19 and 20 with only the current $I_1$ supplied from the current source circuit 2.

In a third operation mode (I2 oscillation mode), the oscillation is maintained as follows: The switches 13, 14, 17, and 42 are fixed in a non-conductive state, the switches 16 and 43 alternately repeat conduction, the switch 16 and the switch 18 repeat conduction in antiphase, and the switch 43 and the switch 15 repeat conduction in antiphase. That is, the oscillation circuit 41 oscillates by charging the variable capacitors 19 and 20 with only the current $I_2$ supplied from the current source circuit 3.

In this oscillation circuit, the variable resistor 5 and the variable resistor 9 are adjusted so that the same oscillation frequency is obtained in the second operation mode and the third operation mode. Then, the state of $I_1 = I_2$, that is, the condition indispensable for second-order frequency deviation compensation, can be easily obtained, and hence the compensation accuracy of oscillation frequency deviation due to the temperature change can be easily improved.

Fifth Embodiment

FIG. 9 is an illustration of a configuration of a relaxation oscillator according to a fifth embodiment of the present invention. The relaxation oscillator has the reference voltage source 1, the current source circuit 2, the current source circuit 3, the oscillation circuit 41, a temperature sensor 50, a calculation circuit 51, a first memory 52, a second memory 53, a capacitor control circuit 54, and a switch 55.

The oscillation circuit 41 in the relaxation oscillator according to the fourth embodiment of the present invention can be used (or the oscillation circuit 4 in the relaxation oscillator according to each of the first, second, and third embodiments of the present invention can also be used) as the oscillation circuit 41 in this embodiment.

The capacitor control circuit 54 has a first calculator 56 and a second calculator 57. In the first memory 52, a capacitor setting value $P_{01}$ of the variable capacitor 19 and a capacitor setting value $P_{02}$ of the variable capacitor 20 at which the first-order frequency deviation of the oscillation circuit 41 vanishes at the reference temperature $T_0$ are stored.

The temperature sensor 50 outputs detected temperature information m to the calculation circuit 51, and the calculation circuit 51 calculates and outputs, according to the temperature information m, a capacitance control value ΔP for compensating for the second-order frequency deviation to zero. The second memory 53 is a memory for storing data necessary for the calculation of ΔP or the compensation value ΔP corresponding to the temperature m, and the calculation circuit 51 designates an address (ADD) to read out the stored data (DATA).

The capacitor control circuit 54 is configured to output control values $SP_1$ and $SP_2$ for the variable capacitors 19 and 20 in the oscillation circuit 41. $SP_1$ is a value obtained by adding ΔP to $P_{01}$ by the first calculator 56, and $SP_2$ is a value obtained by subtracting ΔP from $P_{02}$ by the second calculator 57.

The switch 55 controls whether or not to transmit ΔP to the capacitor control circuit 54. With or without compensation for the second-order frequency deviation can be selected by ON and OFF of the switch 55.

In the relaxation oscillator according to the fifth embodiment of the present invention, first-order and second-order frequency deviations of the oscillation frequency are automatically compensated for by the above-mentioned series of mechanisms, and hence the output frequency $f_1$ of the oscillation circuit 41 can be extremely stably maintained.

Sixth Embodiment

Figure 10:
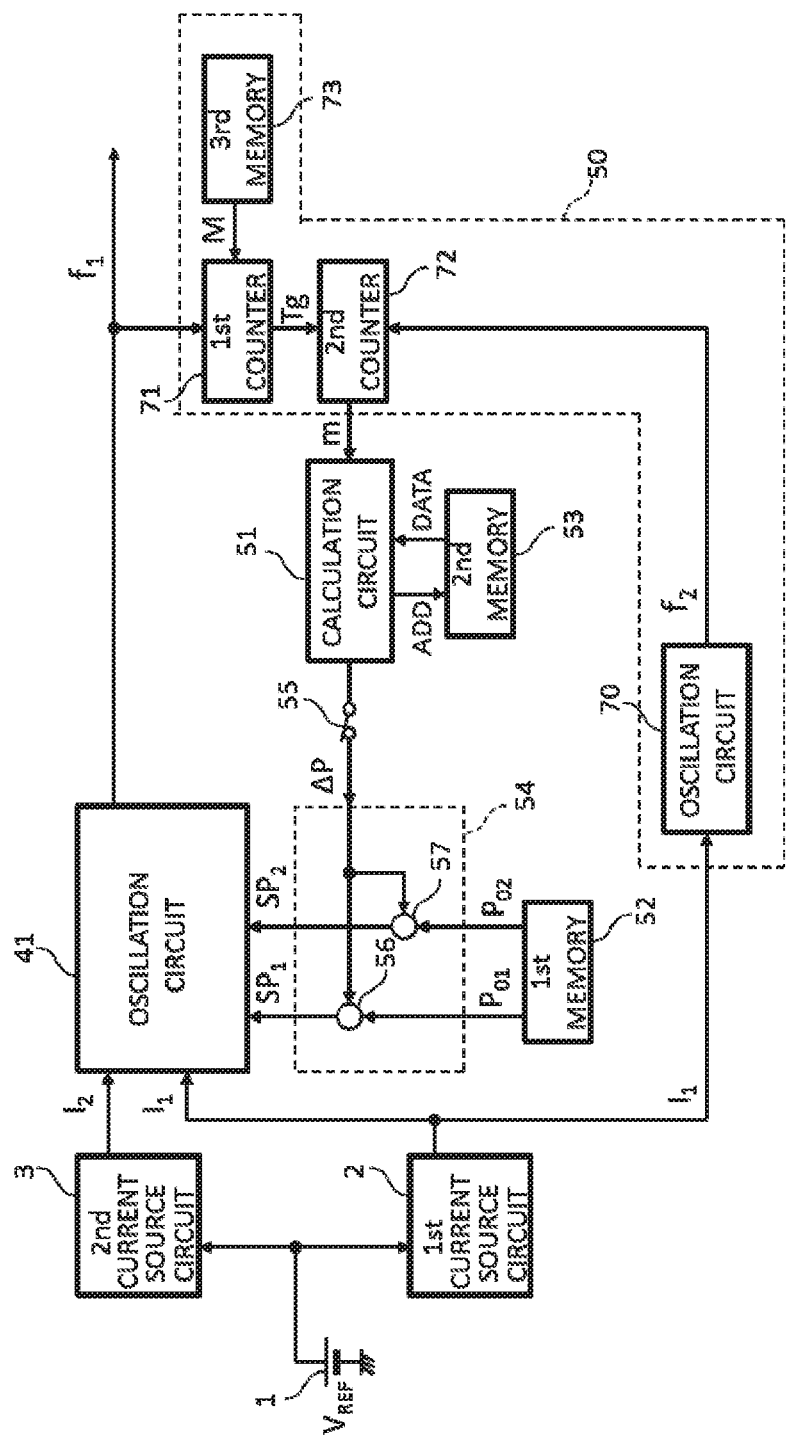
FIG. 10 is a diagram for illustrating a configuration of a relaxation oscillator according to a sixth embodiment of the present invention.

FIG. 10 is an illustration of a relaxation oscillator according to a sixth embodiment of the present invention. In the sixth embodiment, there is provided an example of a further specific configuration of the temperature sensor 50 in the fifth embodiment of the present invention. In the sixth embodiment, other than the oscillation circuit 41 configured to oscillate at the output frequency $f_1$ described in the fifth embodiment, an oscillation circuit 70 is further included in the temperature sensor 50. In this case, description is made for clarity that the oscillation circuit 41 is a first oscillation circuit 41, and the oscillation circuit 70 in the temperature sensor is a second oscillation circuit 70.

Figure 14:
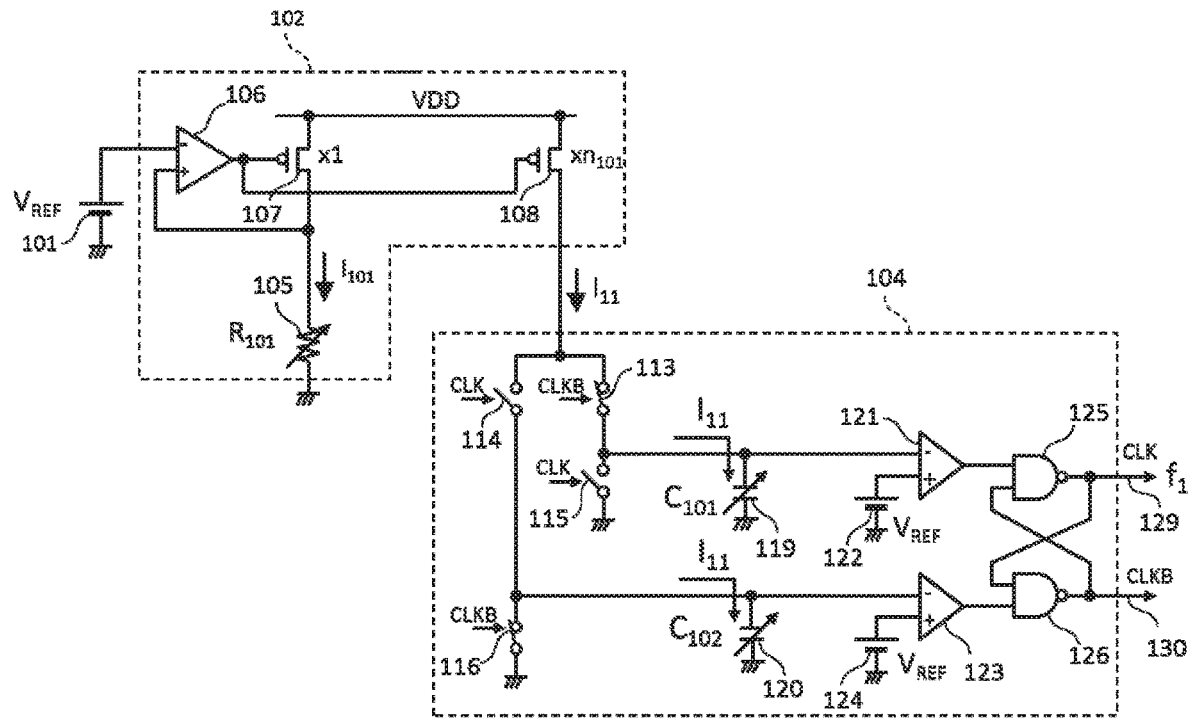
FIG. 14 is a diagram for illustrating a configuration of a relaxation oscillator in related-art.

The temperature sensor 50 has the second oscillation circuit 70, a first counter 71, a second counter 72, and a third memory 73. As the second oscillation circuit 70, for example, an oscillation circuit 104 of the CR oscillator in related-art (FIG. 14) or the oscillation circuit 41 of the relaxation oscillator (FIG. 7) according to the fifth embodiment of the present invention can be used.

In the use of the oscillation circuit 104 in related-art, the current $I_1$ is supplied from the current source circuit 2 (or the current $I_2$ is supplied from the current source circuit 3) to the variable capacitors 119 and 120 in the oscillation circuit 104. And in the use of the first oscillation circuit 41 of the relaxation oscillator according to the fifth embodiment of the present invention, the second operation mode (or the third operation mode) is selected.

Now, description is given of a principle and a procedure of frequency deviation compensation of the relaxation oscillator according to the sixth embodiment of the present invention.

Figure 11:
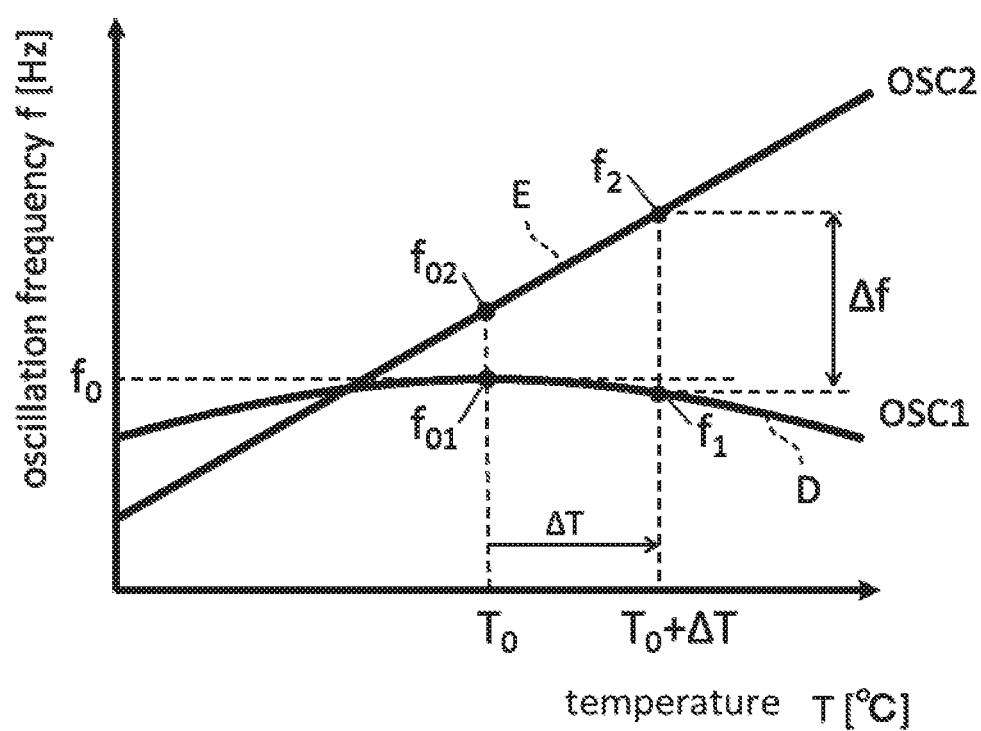
FIG. 11 is a graph for showing temperature characteristics of first and second oscillation circuits used in the relaxation oscillator according to the sixth embodiment of the present invention.

FIG. 11 is a graph for showing temperature characteristics of an oscillation frequency (D) of the first oscillation circuit 41 and an oscillation frequency (E) of the second oscillation circuit 70 under a state in which the switch 55 is opened, that is, a state in which $\Delta P$ is not given to the input of the capacitor control circuit 54 (state of $\Delta P=0$).

In the oscillation frequency (D) of the first oscillation circuit 41, the frequency is $f_{01}$ at the reference temperature $T_0$. The first-order frequency deviation is adjusted to zero, and hence the oscillation frequency can be regarded as substantially constant regardless of temperature. In contrast, the oscillation frequency (E) of the second oscillation circuit 70 largely changes linearly in proportion to temperature due to the first-order temperature coefficient $\alpha_1$ of the variable resistor 5. The frequency at the reference temperature $T_0$ is $f_{02}$.

In this case, the ratio between $f_{01}$ and $f_{02}$ at the reference temperature $T_0$ is defined as q as denoted by Equation (22).

$$q = \frac{f_{02}}{f_{01}} \tag{22}$$

The oscillation frequency $f_2$ of the second oscillation circuit 70 at the temperature $T_0+\Delta T$ can be expressed as Equation (23) by using the definition of Equation (22) when the first-order coefficient $\alpha_1$ of the variable resistor 5 is focused:

$$f_2 = f_{02}(1-\alpha_1 \Delta T) = q \cdot f_{01}(1-\alpha_1 \Delta T) \tag{23}$$

where $f_{01}$ is an oscillation frequency of the first oscillation circuit 41 at the reference temperature $T_0$, $f_{02}$ is an oscillation frequency of the second oscillation circuit 70 at the reference temperature $T_0$, q is a ratio between oscillation frequencies of the first oscillation circuit 41 and the second oscillation circuit 70 at the reference temperature $T_0$, $\alpha_1$ is a first-order temperature coefficient of the variable resistor 4, and $\Delta T$ is a temperature variation amount from the reference temperature $T_0$.

A difference $\Delta f$ between $f_1$ and $f_2$ at the temperature of $T_0+\Delta T$ can be expressed approximately by Equation (24) because $f_1$ is substantially constant regardless of temperature and can be regarded as $f_{01}$.

$$\Delta f = f_2 - f_1 = q \cdot f_{01}(1-\alpha_1 \Delta T) - f_1 \tag{24}$$
$$\approx q \cdot f_{01}(1-\alpha_1 \Delta T) - f_{01} = f_{01}(q-1-q \cdot \alpha_1 \Delta T)$$

The temperature sensor 50 operates under a state in which the switch 55 is opened (state of $\Delta P=0$) and the oscillation frequencies of the first oscillation circuit 41 and the second oscillation circuit 70 are stable.

The first counter 71 counts the output frequency ($f_1$) of the oscillation circuit 41 M times based on the value M stored in the third memory 73 to form a gate time period $T_g$. The second counter 72 counts the number of clocks of the output ($f_2$) of the second oscillation circuit 70 during the period $T_g$ to output a count value m thereof.

The oscillation frequency ($f_2$) of the oscillation circuit 41 at the temperature of $T_0+\Delta T$ can be expressed as Equation (25) when the count number M of the counter 71 and the count value m of the counter 72 are used.

$$f_2 = f_1 \frac{m}{M} \tag{25}$$

The difference $\Delta f$ between $f_1$ and $f_2$ at the temperature of $T_0+\Delta T$ can be expressed approximately as Equation (26) because $f_1$ is substantially constant regardless of temperature and can be regarded as $f_{01}$.

$$\Delta f = f_2 - f_1 = f_1\left(\frac{m}{M}-1\right) \approx f_{01}\left(\frac{m}{M}-1\right) \tag{26}$$

The approximate solution of the temperature change $\Delta T$ is expressed as Equation (27) based on Equation (24) and Equation (26).

$$\Delta T \approx -\frac{m-q \cdot M}{q \cdot M \alpha_1} \tag{27}$$

The number $\Delta P$ of correction values for the setting values of the variable capacitor for compensating for the second-order frequency deviation of the first oscillation circuit 41 is expressed as Equation (28) and Equation (29) by substituting Equation (27) for Equation (21).

$$\Delta P = P_{01}\gamma_1 \Delta T = -\frac{\gamma_1 P n_1 R_{02} \beta_1}{q \cdot M \alpha_1 (n_1 R_{02} \beta_1 - n_2 R_{01} \alpha_1)}(m-q \cdot M) \tag{28}$$

$$\Delta P = -P_{02}\gamma_2 \Delta T = \frac{\gamma_2 P n_2 R_{01}}{q \cdot M (n_2 R_{01} \alpha_1 - n_1 R_{02} \beta_1)}(m-q \cdot M) \tag{29}$$

After the calculation circuit 51 outputs the calculation value $\Delta P$ based on Equation (28) or Equation (29), the switch 55 is closed and $\Delta P$ is input to the capacitor control circuit 54. Then, the capacitor control circuit 54 sets the setting value $P_1$ of the variable capacitor 19 of the first oscillation circuit 41 to $P_{01}+\Delta P$, and sets the setting value $P_2$ of the variable capacitor 20 to $P_{02}-\Delta P$. In this manner, the second-order frequency deviation of the first oscillation circuit 41 is compensated for (corrected).

Description has been given above of an operation in a state in which the switch 55 is opened at the time of detection of temperature change in the temperature sensor 50 (that is, the first oscillation circuit 41 performs only the first-order frequency deviation compensation), but substantially similar effect can be obtained even when the switch 55 is closed at the time of detection of temperature change (that is, the frequency deviation compensation of the first oscillation circuit 41 is performed even for the second order). This is because, even in any of a case in which the frequency deviation compensation of the first oscillation circuit 41 is performed only for the first order (case in which the switch 55 is opened) and a case in which the frequency deviation compensation is performed even for the second order (case in which the switch 55 is closed), the comparison between the oscillation frequency ($f_1$) of the first oscillation circuit 41 and the oscillation frequency ($f_2$) of the second oscillation circuit 70 can be regarded as approximately constant regardless of temperature.

Further, in order to enhance the detection accuracy of the temperature change and enhance the accuracy of the second-order frequency deviation compensation in the configuration of the sixth embodiment, it is effective to form the circuits on the same semiconductor chip so that the current source circuit 2 and the current source circuit 3 are arranged close to each other and thus the temperatures of the variable resistor 5 and the variable resistor 9 are set as uniform as possible. Under this state, when the oscillation circuit 41 is used as the second oscillation circuit 70 in the second operation mode, the relative difference between oscillation frequencies of the first oscillation circuit 41 and the second oscillation circuit 70 is determined based on only the temperature coefficients of the variable resistor 5 and the variable resistor 9. The detection accuracy of the temperature change is thus enhanced, and the accuracy of the frequency deviation compensation is improved.

Seventh Embodiment

Figure 12:
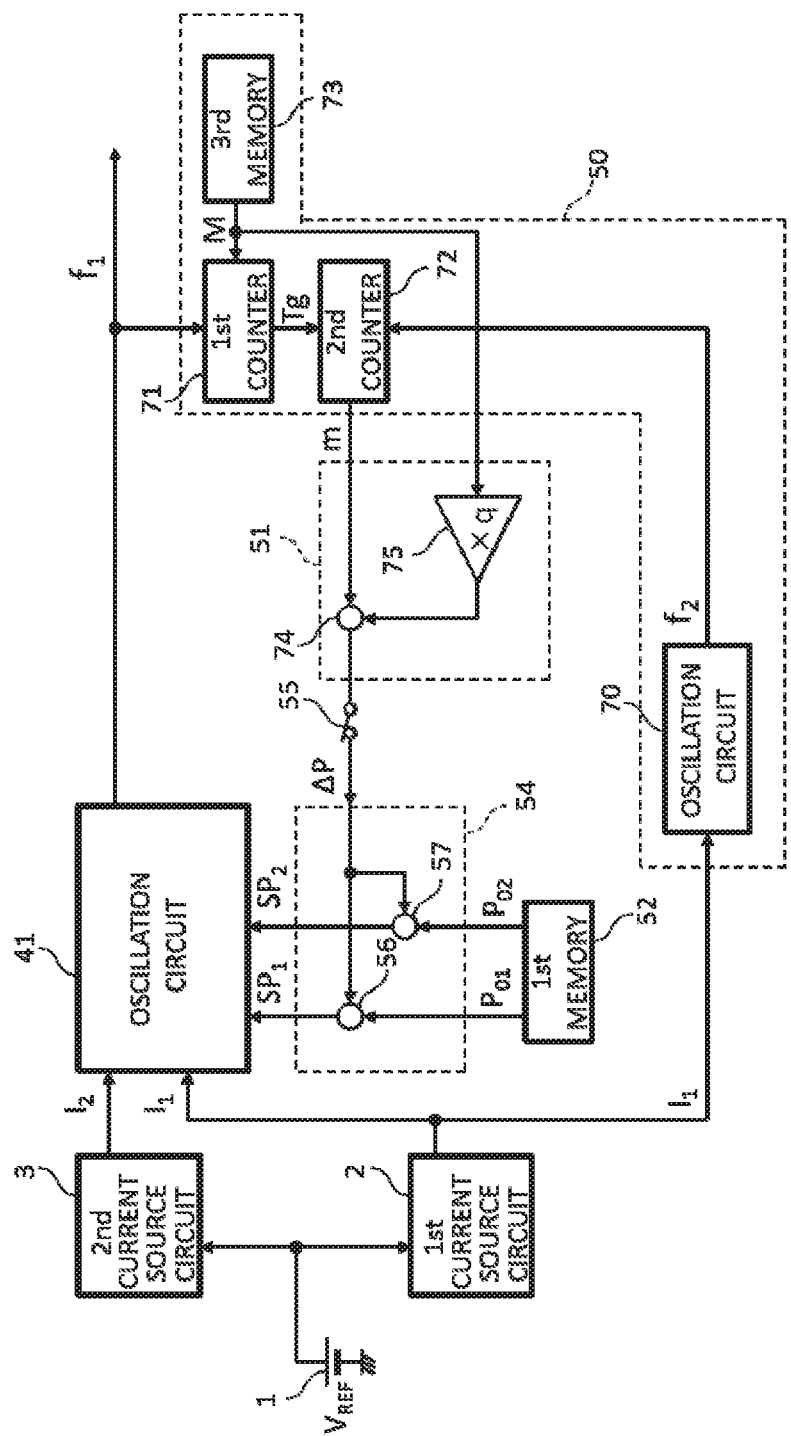
FIG. 12 is a diagram for illustrating a configuration of a relaxation oscillator according to a seventh embodiment of the present invention.

FIG. 12 is an illustration of a relaxation oscillator according to a seventh embodiment of the present invention. FIG. 12 is an illustration of a specific example in which only a simple configuration is required for the calculation circuit 51 in the sixth embodiment of the present invention.

In the configuration of FIG. 10, it is assumed that the count number M of the first counter 71 is set to a specific value $M_{01}$ expressed as Equation (30).

$$M = M_{01} \equiv -\frac{\gamma_1 P n_1 R_{02} \beta_1}{q \cdot \alpha_1 (n_1 R_{02} \beta_1 - n_2 R_{01} \alpha_1)} \quad (30)$$

In this case, only a simple calculation is required for Equation (28) for calculating $\Delta P$ as denoted by Equation (31).

$$\Delta P = m - q \cdot M_{01} \quad (31)$$

That is, when the count value M of the first counter 71 is set to the specific value $M_{01}$, the calculation circuit 51 can be formed only by a subtracter 74 and a multiplier 75, and hence the circuit scale can be largely reduced as compared to the case in which M is set to a freely selected value.

Similarly, even when the count number M of the first counter 71 is set to a specific value $M_{02}$ expressed as Equation (32), only a simple calculation is required for Equation (29) for calculating $\Delta P$ as denoted by Equation (33), and the circuit scale can be largely reduced similarly.

$$M = M_{02} \equiv \frac{\gamma_2 P n_2 R_{01}}{q \cdot (n_2 R_{01} \alpha_1 - n_1 R_{02} \beta_1)} \quad (32)$$

$$\Delta P = m = q \cdot M_{02} \quad (33)$$

In the above, the specific values $M_{01}$ and $M_{02}$ of the count number M of the first counter 71 are described individually, but $M_{01}$ and $M_{02}$ have the same value because the relationship of Equation (21) is satisfied.

Further, when the ratio q between $f_1$ and $f_2$ is a power of 2, the multiplier may be a shift register, and hence the circuit scale of the calculation circuit 51 can be reduced.

As a further specific condition, when q=1 holds, that is, when the first oscillation circuit 41 and the second oscillation circuit 70 have the same frequency at the reference temperature $T_0$, the calculation of $\Delta P$ becomes m-$M_{01}$ or m-$M_{02}$, and the multiplier 75 may be omitted. The circuit scale of the calculation circuit 51 can thus be minimized.

The description of the principle of frequency deviation compensation in the relaxation oscillator according to each of the first to seventh embodiments of the present invention focuses on only the temperature coefficients of the variable resistor 5 and the variable resistor 9, but the largest feature of the present invention resides in that the frequency deviation of the entire oscillator having the influences of the temperature coefficients of elemental components (such as the variable capacitors, the logic elements, and the power supply voltages) other than the resistors forming the oscillator, can be compensated for to be substantially zero.

This compensation becomes possible under a condition in which the absolute values of the temperature coefficients of the elemental components other than the variable resistors are sufficiently smaller than the absolute values of the first-order temperature coefficients $\alpha_1$ and $\beta_1$ of the variable resistor 5 and the variable resistor 9 (as a guide, $\frac{1}{10}$ or smaller of the first-order temperature coefficients of the variable resistors). Under this condition, the temperature coefficients of the variable resistor 5 and the variable resistor 9 are dominant in the variation of the oscillation frequency with respect to temperature, and hence the first-order frequency deviation of the entire oscillator can be independently adjusted to be decreased to zero by adjusting the ratio between $P_{01}$ and $P_{02}$. Further, the second-order frequency deviation of the entire oscillator can be independently adjusted to be decreased to substantially zero by increasing and decreasing the count value M of the first counter 71 (that is, the gate time period of the second counter 72).

Eighth Embodiment

Figure 13:
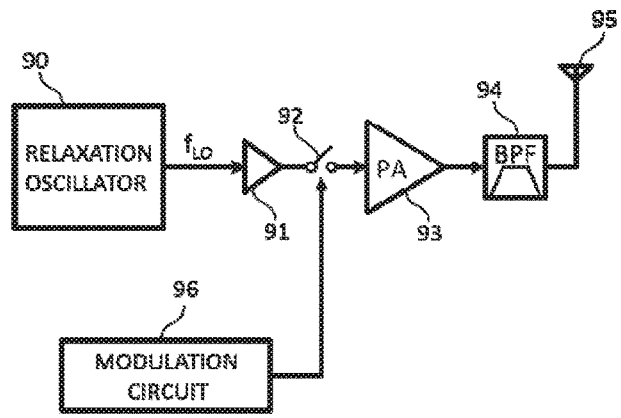
FIG. 13 is an application example of the relaxation oscillators according to the first to seventh embodiments of the present invention.

FIG. 13 is an illustration of an example in which the relaxation oscillator according to one of the first to seventh embodiments of the present invention is applied to a wireless transmitter. As a relaxation oscillator 90, the relaxation oscillator according to any one of the first to seventh embodiments of the present invention is used. The wireless transmitter further has a buffer amplifier 91, a switch 92, a power amplifier 93, a band-pass filter 94, an antenna 95, and a modulation circuit 96.

An output signal of the relaxation oscillator 90 is connected to the switch 92 via the buffer amplifier 91, and the switch 92 is turned on or off through the control from the modulation circuit 96. In this manner, OOK modulation is performed, and the modulated signal is amplified by the power amplifier 93 so that a spurious component is attenuated in the band-pass filter 94. After that, the signal is radiated as radio waves from the antenna 95.

The frequency deviation of the relaxation oscillator according to each of the first to seventh embodiments of the present invention is extremely small, and hence the relaxation oscillator can be used as a reference oscillator of a wireless communication device which has been difficult in the relaxation oscillator in related-art.

What is claimed is:

1. A relaxation oscillator, comprising:
   a reference voltage source configured to supply a reference voltage;
   a first current source circuit having a first resistor, and is configured to generate a first current based on the reference voltage;
   a second current source circuit having a second resistor, and is configured to generate a second current based on the reference voltage;
   a first variable capacitor;
   a second variable capacitor;
   a first switch configured to control charging from the first current source circuit to the first variable capacitor;
   a second switch configured to control charging from the second current source circuit to the second variable capacitor;
   a third switch configured to control discharging of charges in the first variable capacitor;
   a fourth switch configured to control discharging of charges in the second variable capacitor;
   a first comparator configured to compare a voltage of the first variable capacitor with the reference voltage source;
   a second comparator configured to compare a voltage of the second variable capacitor with the reference voltage source; and
   an SR latch circuit configured to receive an output of the first comparator and an output of the second comparator,
   wherein a product of a ratio of the first current to the second current and a ratio of a first-order temperature coefficient of the second resistor to a first-order temperature coefficient of the first resistor, and a ratio of a capacitance of the first variable capacitor to a capacitance of the second variable capacitor have the same absolute value and opposite signs.

2. A relaxation oscillator according to claim 1,
   wherein the first current and the second current are adjusted to be equal to each other at a reference temperature, and
   wherein the capacitance of the first variable capacitor and the capacitance of the second variable capacitor are configured to increase and decrease while a sum of the capacitance of the first variable capacitor and the capacitance of the second variable capacitor is kept constant.

3. A relaxation oscillator according to claim 2, further comprising:
   a fifth switch configured to control charging from the first current source circuit to the second variable capacitor;
   a sixth switch configured to control charging from the second current source circuit to the first variable capacitor; and
   a gating circuit,
   the relaxation oscillator being configured to perform:
      a first oscillation mode of charging the first variable capacitor with the first current and charging the second variable capacitor with the second current;
      a second oscillation mode of charging the first variable capacitor and the second variable capacitor with the first current; and
      a third oscillation mode of charging the first variable capacitor and the second variable capacitor with the second current.

4. A relaxation oscillator according to claim 2, further comprising:
   a first memory;
   a second memory;
   a temperature sensor;
   a calculation circuit; and
   a capacitor control circuit,
   wherein the calculation circuit is configured to receive, as input, temperature data of the temperature sensor and a value of the second memory,
   wherein the capacitor control circuit is configured to receive, as input, output of the calculation circuit and a value of the first memory, and
   wherein the capacitance of the first variable capacitor and the capacitance of the second variable capacitor are controlled based on output of the capacitor control circuit.

5. A relaxation oscillator according to claim 1, further comprising:
   a fifth switch configured to control charging from the first current source circuit to the second variable capacitor;
   a sixth switch configured to control charging from the second current source circuit to the first variable capacitor; and
   a gating circuit,
   the relaxation oscillator being configured to perform:
      a first oscillation mode of charging the first variable capacitor with the first current and charging the second variable capacitor with the second current;
      a second oscillation mode of charging the first variable capacitor and the second variable capacitor with the first current; and
      a third oscillation mode of charging the first variable capacitor and the second variable capacitor with the second current.

6. A relaxation oscillator according to claim 5 further comprising:
   a first memory;
   a second memory;
   a temperature sensor;
   a calculation circuit; and
   a capacitor control circuit,
   wherein the calculation circuit is configured to receive, as input, temperature data of the temperature sensor and a value of the second memory,
   wherein the capacitor control circuit is configured to receive, as input, output of the calculation circuit and a value of the first memory, and
   wherein the capacitance of the first variable capacitor and the capacitance of the second variable capacitor are controlled based on output of the capacitor control circuit.

7. A relaxation oscillator according to claim 1, further comprising:
   a first memory;
   a second memory;
   a temperature sensor;
   a calculation circuit; and a capacitor control circuit,
wherein the calculation circuit is configured to receive, as input, temperature data of the temperature sensor and a value of the second memory,
wherein the capacitor control circuit is configured to receive, as input, output of the calculation circuit and a value of the first memory, and
wherein the capacitance of the first variable capacitor and the capacitance of the second variable capacitor are controlled based on output of the capacitor control circuit.

8. A relaxation oscillator according to claim 7, wherein the temperature sensor has a second oscillation circuit, a first counter, a second counter, and a third memory.

9. A relaxation oscillator according to claim 8, wherein, at the reference temperature, a frequency ratio between an oscillation frequency of the SR latch circuit and an oscillation frequency of the second oscillation circuit included in the temperature sensor is a ratio of a power of 2.

10. A relaxation oscillator according to claim 8, wherein, at the reference temperature, an oscillation frequency of the SR latch circuit and an oscillation frequency of the second oscillation circuit included in the temperature sensor are the same.

11. A relaxation oscillator comprising:
a reference voltage source configured to supply a reference voltage, wherein the reference voltage source has a first inverter configured to perform feedback from output to input;
a first current source circuit having a first resistor, and is configured to generate a first current based on the reference voltage;
a second current source circuit having a second resistor, and is configured to generate a second current based on the reference voltage;
a first variable capacitor;
a second variable capacitor;
a first switch configured to control charging from the first current source circuit to the first variable capacitor;
a second switch configured to control charging from the second current source circuit to the second variable capacitor;
a third switch configured to control discharging of charges in the first variable capacitor;
a fourth switch configured to control discharging of charges in the second variable capacitor;
a second inverter having a threshold voltage that is equal to a threshold voltage of the first inverter and configured to invert a voltage of the first variable capacitor in accordance with the threshold voltage;
a third inverter having a threshold voltage that is equal to the threshold voltage of the first inverter and configured to invert a voltage of the second variable capacitor in accordance with the threshold voltage; and
an SR latch circuit configured to receive an output of the second inverter and an output of the third inverter,
wherein a product of a ratio of the first current to the second current and a ratio of a first-order temperature coefficient of the second resistor to a first-order temperature coefficient of the first resistor, and a ratio of a capacitance of the first variable capacitor to a capacitance of the second variable capacitor have the same absolute value and opposite signs.

12. A relaxation oscillator according to claim 11,
wherein the first current and the second current are adjusted to be equal to each other at a reference temperature, and
wherein the capacitance of the first variable capacitor and the capacitance of the second variable capacitor are configured to increase and decrease while a sum of the capacitance of the first variable capacitor and the capacitance of the second variable capacitor is kept constant.

13. A relaxation oscillator according to claim 11, further comprising:
a fifth switch configured to control charging from the first current source circuit to the second variable capacitor;
a sixth switch configured to control charging from the second current source circuit to the first variable capacitor; and
a gating circuit,
the relaxation oscillator being configured to perform:
a first oscillation mode of charging the first variable capacitor with the first current and charging the second variable capacitor with the second current;
a second oscillation mode of charging the first variable capacitor and the second variable capacitor with the first current; and
a third oscillation mode of charging the first variable capacitor and the second variable capacitor with the second current.

14. A relaxation oscillator according to claim 11 further comprising:
a first memory;
a second memory;
a temperature sensor;
a calculation circuit; and
a capacitor control circuit,
wherein the calculation circuit is configured to receive, as input, temperature data of the temperature sensor and a value of the second memory,
wherein the capacitor control circuit is configured to receive, as input, output of the calculation circuit and a value of the first memory, and
wherein the capacitance of the first variable capacitor and the capacitance of the second variable capacitor are controlled based on output of the capacitor control circuit.

15. A wireless device comprising the relaxation oscillator of claim 1, wherein the wireless device is configured to use output of the relaxation oscillator of claim 1 as a reference frequency source.

16. A wireless device comprising the relaxation oscillator of claim 2, wherein the wireless device is configured to use output of the relaxation oscillator of claim 2 as a reference frequency source.

17. A wireless device comprising the relaxation oscillator of claim 11, wherein the wireless device is configured to use output of the relaxation oscillator of claim 11 as a reference frequency source.

18. A wireless device comprising the relaxation oscillator of claim 5, wherein the wireless device is configured to use output of the relaxation oscillator of claim 5 as a reference frequency source.

19. A wireless device comprising the relaxation oscillator of claim 7, wherein the wireless device is configured to use output of the relaxation oscillator of claim 7 as a reference frequency source.

* * * * *